US006757206B2

(12) United States Patent
McAdams et al.

(10) Patent No.: US 6,757,206 B2
(45) Date of Patent: Jun. 29, 2004

(54) SENSE AMPLIFIER WITH OVERRIDE WRITE CIRCUITRY

(75) Inventors: Hugh P. McAdams, McKinney, TX (US); Juergen Rickes, Cupertino, CA (US); Sudhir K. Madan, Richardson, TX (US)

(73) Assignees: Texas Instruments Incorporated, Dallas, TX (US); Agilent Technologies, Incorporated, Palo Alto, CA (US)

( * ) Notice: Subject to any disclaimer, the term of this patent is extended or adjusted under 35 U.S.C. 154(b) by 120 days.

(21) Appl. No.: 10/245,081

(22) Filed: Sep. 17, 2002

(65) Prior Publication Data

US 2004/0052141 A1 Mar. 18, 2004

(51) Int. Cl.[7] ................................. G11C 7/02
(52) U.S. Cl. .................. 365/207; 365/145; 365/205
(58) Field of Search ................. 365/207, 145, 365/205, 189.01, 189.04

(56) References Cited

U.S. PATENT DOCUMENTS

| | | | |
|---|---|---|---|
| 4,081,701 A | 3/1978 | White, Jr. et al. | |
| 4,716,320 A | 12/1987 | McAdams | |
| 5,029,136 A | 7/1991 | Tran et al. | |
| 5,790,467 A | 8/1998 | Haukness et al. | |
| 5,831,919 A | 11/1998 | Haukness et al. | |
| 6,078,529 A | * 6/2000 | Tada | 365/189.07 |
| 6,198,653 B1 | * 3/2001 | Tanaka | 365/145 |
| 6,590,798 B1 | * 7/2003 | Komatsuzaki | 365/145 |

\* cited by examiner

Primary Examiner—Anh Phung
(74) Attorney, Agent, or Firm—Jacqueline J. Garner; W. James Brady, III; Frederick J. Telecky, Jr.

(57) ABSTRACT

Methods and apparatus are disclosed for selectively coupling sense amps with local IO lines in memory devices, comprising first and second selection systems operable to selectively couple a sense amp terminal with a local IO line. A first selection system is coupled with a local IO line and a sense amp, providing selective coupling thereof a second time period after the sense amp is enabled. A second selection system is coupled with the local IO line and the sense amp, which couples the local IO line with the sense amp a first time period before the sense amp is enabled during a write operation, wherein the first time period may be zero.

34 Claims, 7 Drawing Sheets

SENSE AMPLIFIER WITH OVERRIDE WRITE CIRCUITRY

FIELD OF INVENTION

The present invention relates generally to semiconductor devices and more particularly to improved apparatus and methods for coupling local IO lines with sense amplifiers for accessing ferroelectric and other type memory cells in memory devices.

BACKGROUND OF THE INVENTION

Ferroelectric memory devices, like other semiconductor memories, are used for storing data and/or program code in personal computer systems, embedded processor-based systems, and the like. Ferroelectric memories are commonly organized in single-transistor, single-capacitor (1T1C) or two-transistor, two-capacitor (2T2C) cell configurations, in which data is read from or written to the device using address signals and various other control signals. The individual memory cells typically include one or more ferroelectric (FE) capacitors adapted to store a binary data bit, as well as one or more access transistors, typically MOS devices, operable to selectively connect the FE capacitor to one of a pair of complimentary bitlines, with the other bitline being connected to a reference voltage.

The ferroelectric memory cells are commonly organized as individual bits of a corresponding data word, wherein the cells of a given word are accessed concurrently through activation of platelines and wordlines by address decoding circuitry. Such devices are typically organized internally into blocks, sections, segments, rows and columns. For example, a 64M device may include 8 blocks of 8M each, the blocks each consisting of 8 sections which contain 32 segments, Each segment contains 512 words or rows of 64 bits or columns per word. When a data word is read, the cell data from the corresponding bit in each of the 64 columns is sensed using 64 individual sense amplifiers associated with the individual data cell columns.

Data in a ferroelectric data cell is read by connecting the cell capacitor on a first bitline and a reference voltage on a complementary bitline to the input terminals of a differential sense amp. The plateline of the accessed cell is then pulsed. This provides a differential voltage on the bitline pair, which is connected to a sense amp circuit. The reference voltage is typically supplied at an intermediate voltage between a voltage ($V_{``0"}$) associated with a capacitor charged to a binary "0" and that of the capacitor charged to a binary "1" ($V_{``1"}$). The resulting differential voltage at the sense amp terminals represents the data stored in the cell, which is amplified and applied to a pair of local IO lines. The transfer of data between the ferroelectric memory cell, the sense amp circuit, and the local IO lines is controlled by various access transistors, typically MOS devices, with switching signals being provided by control circuitry in the device.

In a typical ferroelectric memory read sequence, two sense amp terminals or bitlines are initially equalized to ground, and then floated, after which a target ferroelectric memory cell is connected to one of the sense amp terminals via the bitline to which the cell is connected. Thereafter, a reference voltage is connected to the remaining sense amp terminal, and the sense amp senses the differential voltage across the terminals and latches a voltage indicative of whether the target cell was programmed to a binary "0" or to a "1". The sense amp terminals are then coupled to local IO lines, which were previously precharged to a predetermined voltage state, such as VDD. The sense amp drives one of the local IO lines to a different voltage state, by which the read data state is passed to an IO buffer circuit. In a write operation, the sense amp and bitline terminals are connected to the local IO lines, which are driven to opposite voltage states depending on the data to be written. One bitline connects to the ferroelectric memory cell for storage of the data written into the ferroelectric capacitor.

FIGS. 1 and 2 illustrate a ferroelectric memory device 2 organized in a folded bitline architecture, wherein a segment portion of the device 2 has 512 rows (words) and 64 columns (bits) of data storage cells $C_{ROW\text{-}COLUMN}$, where each column of cells is accessed via a pair of complimentary data bitlines $BL_{COLUMN}$ and $BL_{COLUMN}'$. One column of the device 2 is illustrated in FIG. 2, in which cells C1-1 through C1-64 form a data word accessible via a wordline WL1 and complimentary bitline pairs BL1/BL1' through BL64/BL64'. The cell data is sensed during data read operations using sense amp circuits 12 (S/A C1 through S/A C64) associated with columns 1 through 64, respectively. In a typical folded bitline architecture ferroelectric memory device, the cells $C_{ROW\text{-}COLUMN}$ individually include one or more ferroelectric cell capacitors and one or more access transistors to connect the cell capacitors between one of the complimentary bitlines associated with the cell column and a plateline, where the other bitline is selectively connected to a reference voltage.

In the device 2, the sense amps 12 associated with even numbered columns are located at the bottom of the segment, whereas sense amps 12 associated with odd numbered columns are located at the top of the segment. Shared reference generators 8' and 8 are provided at the top and bottom of the segment columns, respectively. An even column reference generator 8 is provided at the bottom of the segment columns for providing a reference voltage for even numbered columns and an odd column reference generator 8' is provided at the top of the columns for the odd numbered columns. The reference voltages from the generators 8, 8' are coupled to one of the bitlines in the columns using one of a pair of switches 8a, 8b, depending upon whether an even or odd numbered wordline is selected. In reading the first data word of the illustrated segment along the wordline WL1 in the device 2, the cells C1-1 through C1-64 are connected to the sense bitlines BL1, BL2 . . . , BL63, and BL64 while the complimentary reference bitlines BL1', BL2' . . . , BL63', and BL64' are floating. The reference bitlines BL1', BL2' . . . BL63', and BL64' are thereafter connected to the reference voltage generators 8, 8'.

As illustrated in FIG. 2, the ferroelectric memory cells 4 include capacitors $C_{FE}$ constructed with ferroelectric dielectric material which may be polarized in one direction or another in order to store a binary value. The ferroelectric effect allows for the retention of a stable polarization in the absence of an applied electric field due to the alignment of internal dipoles within Perovskite crystals in the dielectric material. This alignment may be selectively achieved by application of an electric field to the ferroelectric capacitor $C_{FE}$ in excess of the coercive field of the material. Conversely, reversal of the applied field reverses the internal dipoles.

In ferroelectric memories, as well as conventional DRAMs, the connection of local IO lines LIO/LIO' to the sense amp terminals SABL/SABL' is timed during read operations to occur a certain time after the connection of the sense amp terminals SABL/SABL' to the memory cell 4 and the reference 8. This is done to prevent disturbance in the sensing operation of the sense amp 12, where the data bitlines BL1/BL1' are initially separated by only a small voltage difference (e.g., tens or hundreds of millivolts). In this regard, the local IO lines, which are precharged at the beginning of the read operation, are typically fairly large in capacitance. As a result, charge from the local IO lines is provided to the sense amp terminals upon connection therewith, which may disturb the amplification operation in the sense amp if connected before sufficient amplification has occurred, leading to degradation of sense margin, and possibly to incorrect data being provided to the local IO buffering circuitry (data polarity flipping). Thus, the timing of LIOS is controlled so as to actuate the access transistors 20a and 20b a sufficient time after the sense amp is enabled by turning on transistors MP2 and MN2 via sense amp enable signals SE and SE'.

In DRAMs, the same LIOS timing may be employed for both read and write cycles, wherein LIOS is actuated to connect the sense amp 16 with the local IO lines LIO and LIO' a certain time after the sense amp 12 is enabled. However, ferroelectric memory cells typically store a larger charge density and have larger capacitance values than do conventional DRAM cells. Because of the larger capacitance and higher charge density, more time is required to write a ferroelectric memory cell 4 than a typical DRAM data cell. Thus, in the ferroelectric memory device 2, it may be desirable to provide the LIOS signal relatively early in a write cycle to allow the sense amp to fully program the ferroelectric memory cell capacitor. However, as discussed above, minimum timing requirements are set during read operations to prevent connection of local IO lines LIO/LIO' from interfering with sense amp amplification of data read from the cell. Thus, it is not always possible to simply provide the LIOS signal earlier in both the read and write operations for ferroelectric memory devices.

One solution might be to provide the local IO select signal LIOS earlier in a write cycle than in a read cycle. However, memory applications require selective write masking wherein one or more bits in a data word may be written while others are not. In such a masked-write operation, the cells associated with the masked bits undergo a pseudo read operation, in which the existing cell data is read out to the sense amp, and then restored back into the cell. In the case of a masked write, early assertion of the LIOS signal could lead to the above described failure mechanism for the masked bit cells. Thus, there is a need for improved methods and apparatus for coupling ferroelectric memory sense amps with local IO lines to facilitate memory cell access in both read and write operations.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One aspect of the invention provides memory devices, such as ferroelectric memories and sensing systems therefor, in which one or more local IO lines are selectively coupled with a sense amp earlier in a write operation than in a read operation. This may be employed to facilitate proper charging of memory cell capacitors during writing, while allowing mitigation of the above-mentioned sensing disturbance during reading. In certain implementations, moreover, the invention allows foregoing the early write operation coupling where a masked write operation is taking place. Thus, the invention finds utility in ferroelectric memory devices which allow a user to selectively write one or more bits along a wordline while masking others, wherein the written bit cells undergo a write operation with the early sense amp/local IO line coupling, and the masked bit cells undergo a pseudo read operation using the later coupling. The invention may be employed in association with any type of sense amp and memory cell circuitry and architectures.

In one example, first and second IO selection circuits or selection systems are provided for selectively coupling a sense amp with one or more associated local IO lines. A first IO select circuit is coupled with a local IO line and the sense amp, which selectively couples them to provide data from the sense amp to the local IO line during a read operation. A second IO select circuit is also coupled with the local IO line and the sense amp, which operates to selectively couple the local IO line with the sense amp during a write operation.

In one implementation, illustrated and described below, the second IO select circuit comprises first and second switching devices connected in series between the local IO line and the sense amp, which operate to selectively couple the sense amp and the local IO line with one another according to a write control signal and a voltage on a complimentary local IO line during the write operation. The inventors have appreciated that the invention may be employed to provide enough time for proper programming of ferroelectric memory cell capacitors during normal write operations while refraining from such coupling during masked-write and read operations until the sense amp has sufficiently amplified cell data voltages to avoid or mitigate sense amp disturbance problems associated with connection of the local IO lines thereto.

In this example, where the associated IO buffer refrains from providing data to the local IO lines, such as where a write mask is being used, the second IO select circuit selectively refrains from early coupling of the sense amp and the local IO line. In this case, the first IO select circuit provides for later coupling according to the timing constraints appropriate for a normal read cycle, whereby the pseudo read operation is not disturbed by premature connection of the local IO lines. In another example, the first IO select circuit couples the local IO line with the sense amp a second time period after the sense amp is enabled during the read operation, and the second IO select circuit couples the local IO line with the sense amp a first time period before the sense amp is enabled during a write operation, in which the first time period may be zero.

Another aspect of the invention provides methods for selectively coupling a sense amp to a local IO line during a memory access operation in a memory device. The methods comprise enabling the sense amp, coupling the sense amp with the local IO line a first time period prior to or coincident with enabling the sense amp during a write operation, and selectively coupling the sense amp with the local IO line a second time period after enabling the sense amp during a read operation.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
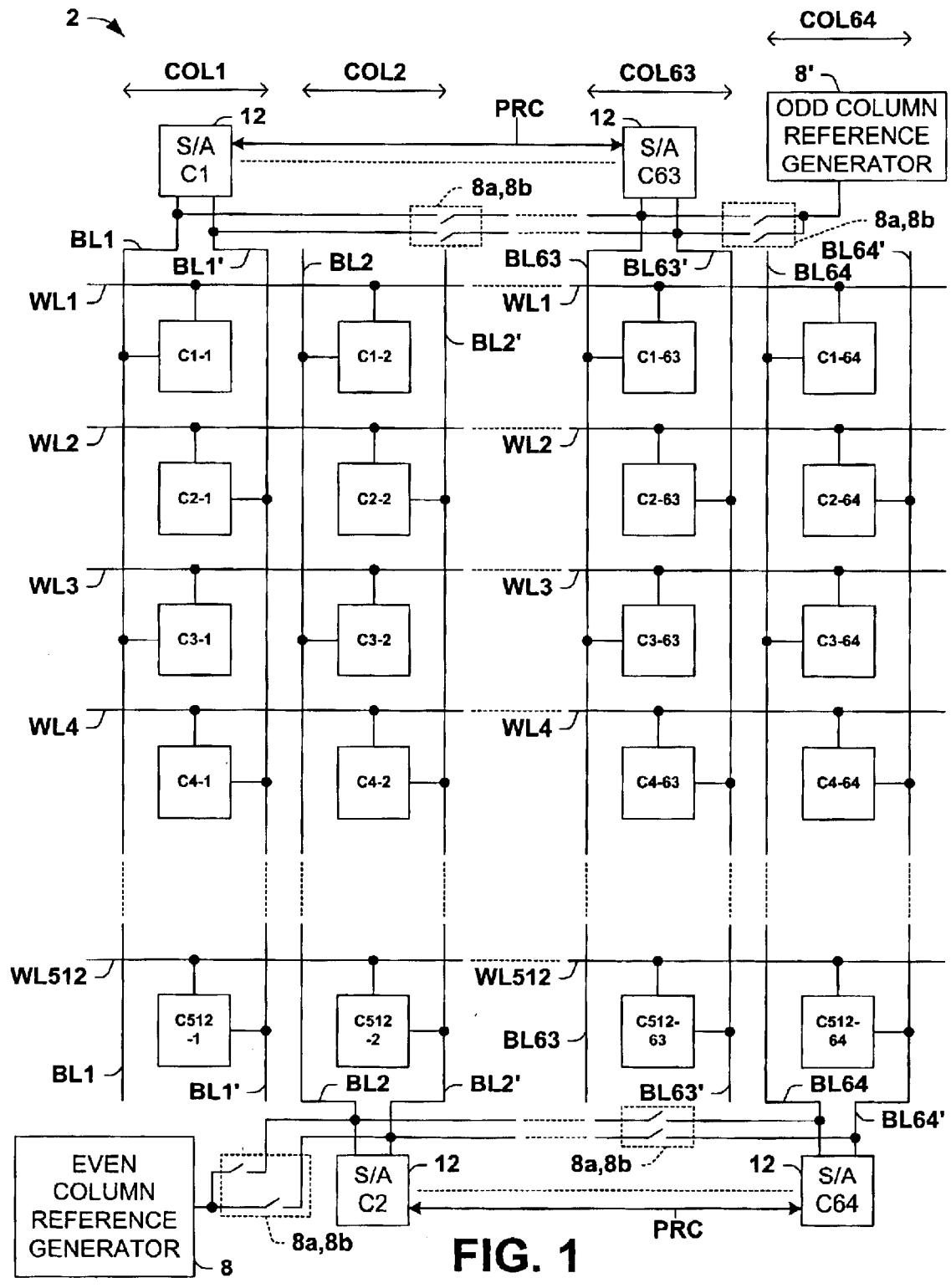
FIG. 1 is a schematic diagram illustrating a segment portion of a folded bitline ferroelectric memory device having a conventional sense amp and associated selection circuitry.
Figure 2:
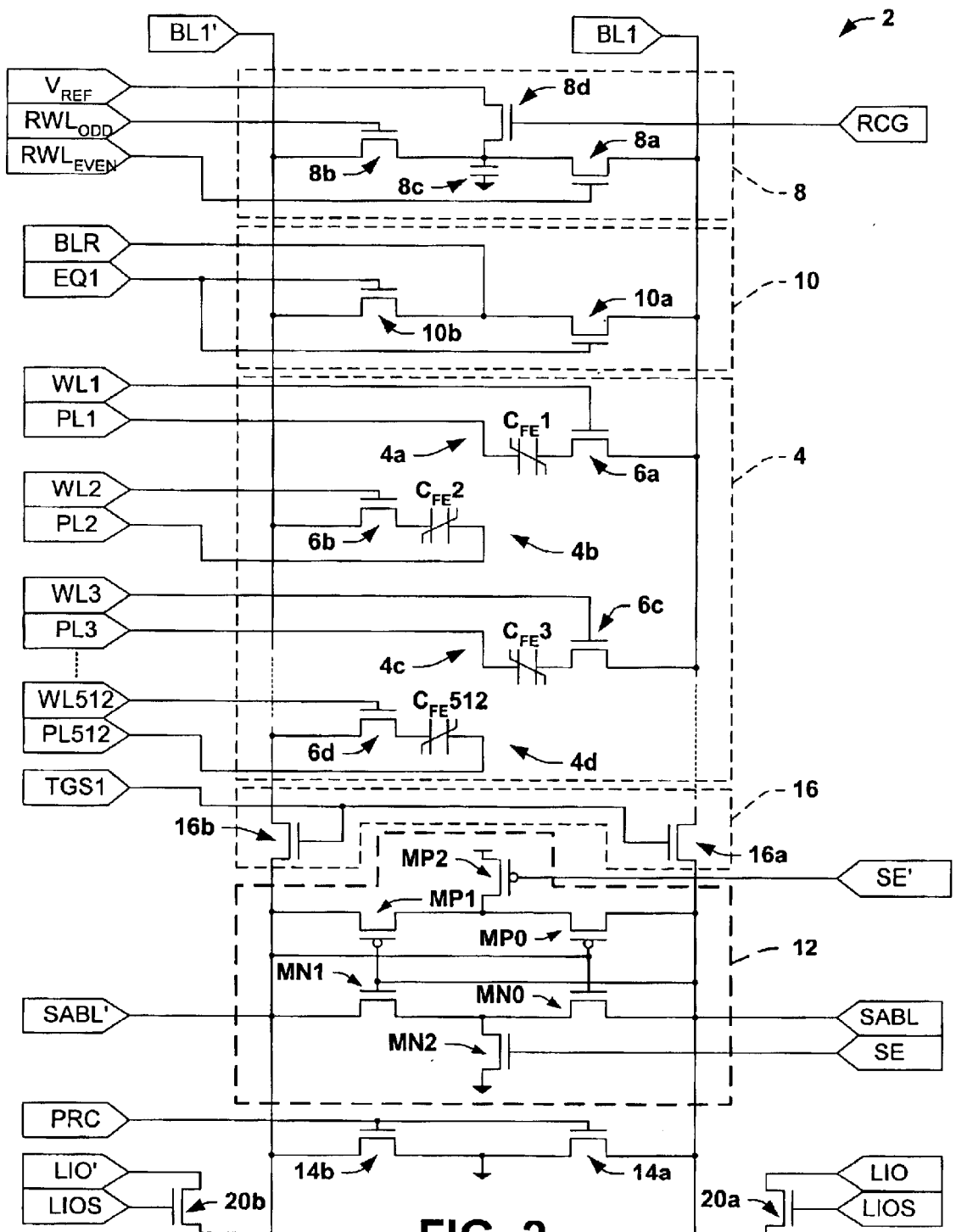
FIG. 2 is a schematic diagram illustrating a portion of a column of the memory device of FIG. 1 and a sense amp circuit.

The present invention will now be described with reference to the attached drawings, wherein like reference numerals are used to refer to like elements throughout. The invention relates to ferroelectric memory apparatus and sensing systems and methodologies therefor, by which sense amps may be selectively coupled with local IO lines during various memory access operations. One or more exemplary implementations of the various aspects of the invention are hereinafter illustrated and described in the context of ferroelectric memory devices comprising single transistor, single capacitor (1T1C) memory cells organized in folded bitline architectures, in which selection systems or circuits are provided for controlled coupling of sense amp terminals with local IO lines. However, it will be appreciated by those of ordinary skill in the art that the invention is not limited to such applications, and that the illustrations and descriptions provided herein are exemplary in nature. Thus, the various aspects of the invention may be employed in association with memory devices of different sizes and configurations than the exemplary folded bitline device 102 illustrated and described herein.

Figure 5:
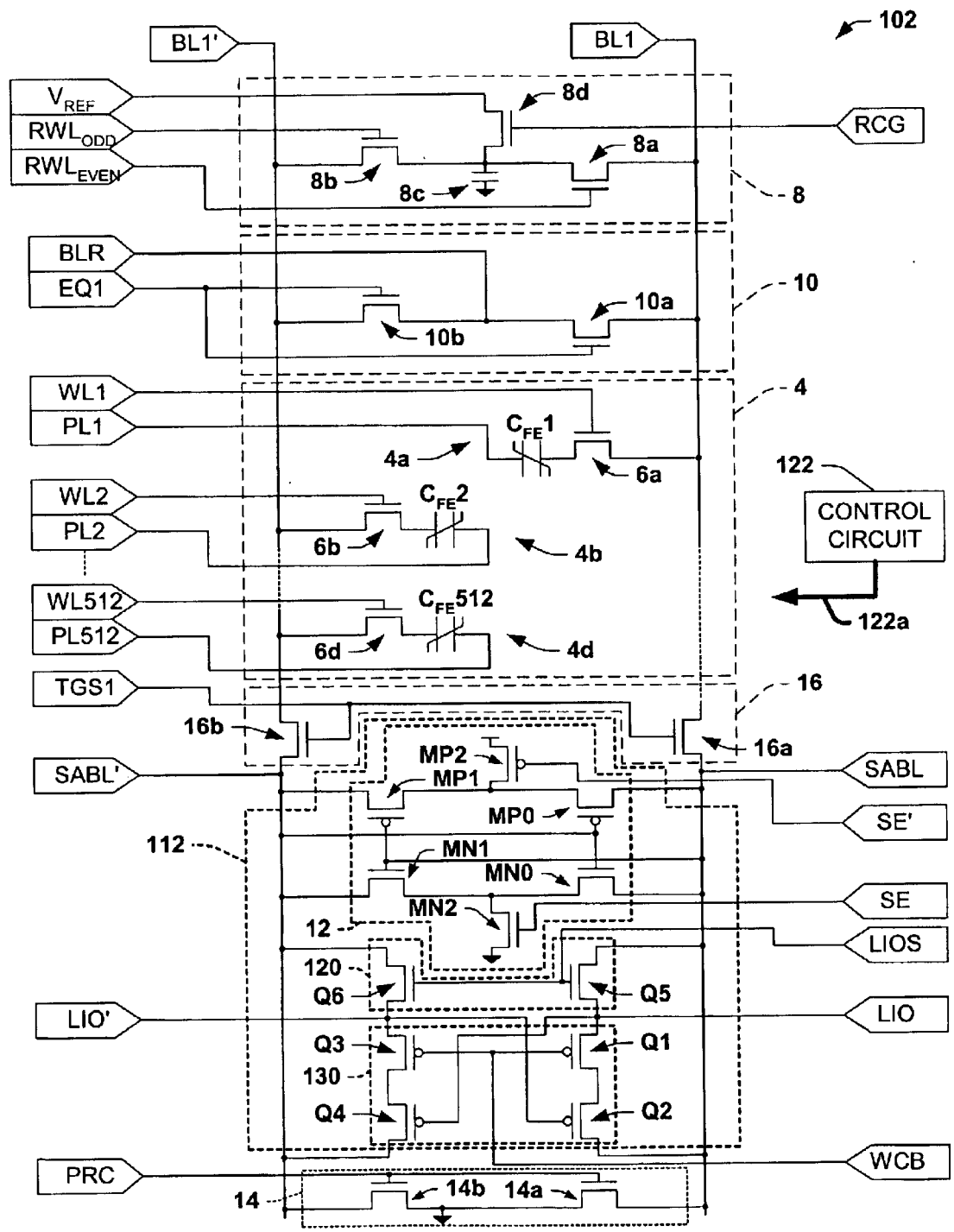
FIG. 5 is a schematic diagram illustrating a portion of a column of the exemplary memory device employing the selection system of FIG. 3.

One exemplary implementation of the invention is illustrated in FIGS. 3–6C, in a folded-bitline architecture ferroelectric memory device 102 comprising one or more data cell columns of 512 1T1C ferroelectric (FE) memory cells 4 (FIG. 5). FE capacitors $C_{FE}1$–$C_{FE}512$ and MOS access transistors 6a–6d are configured in a column along a pair of complimentary bitlines BL1 and BL1', wherein memory segments in the exemplary device individually comprise 64 such columns. The cells 4a–4d and the contents thereof are accessed during read, restore, and write operations via the bitlines BL1 and BL1' using wordline and plateline signals WL1–WL512 and PL1–PL512, respectively. The FE capacitors in odd numbered data words, such as $C_{FE}1$ may be connected to the bitline BL1 via WL1 and PL1, and the FE capacitors in even numbered data words, such as $C_{FE}2$ may be connected to the bitline BL1' via WL2 and PL2. A reference voltage $V_{REF}$ is applied to the other data cell column bitline from a shared reference voltage generator 8 using a transistor 8a or 8b via reference wordline signals $RWL_{ODD}$ or $RWL_{EVEN}$ and a precharged reference capacitor 8c, which is precharged to a reference voltage $V_{REF}$ using a transistor 8d according to a reference cell gate signal RCG.

The bitlines BL1 and BL1' are precharged or equalized during various memory access operations to a bitline reference voltage BLR, such as VSS or ground, via a bitline equalization circuit 10 using transistors 10a and 10b according to a signal EQ1. A cross-coupled latch sense amp circuit 12 is provided as part of a sensing system 112, together with an IO select read circuit 120 and an IO select write circuit 130 in accordance with the invention. The sense amp 12 comprises sense amp bitlines or terminals SABL and SABL', and is enabled using sense amp enable signals SE and SE'. During read and write operations, the sense amp bitlines SABL and SABL' are precharged to VSS via transistors 14a and 14b of a sense amp precharge circuit 14 and a signal PRC. These and other control and/or timing signals 122a are provided by a control circuit 122, as illustrated and described below with respect to FIG. 4. The data and sense amp bitline pairs BL1/BL1' and SABL/SABL' are coupled to one another via transistors 16a and 16b, respectively, of a sense amp connect circuit 16 using a signal TGS1. Although illustrated and described herein using the exemplary cross-coupled sense amp 12 of FIGS. 3 and 5, the invention finds utility in association with any type of sense amp.

Figure 3:
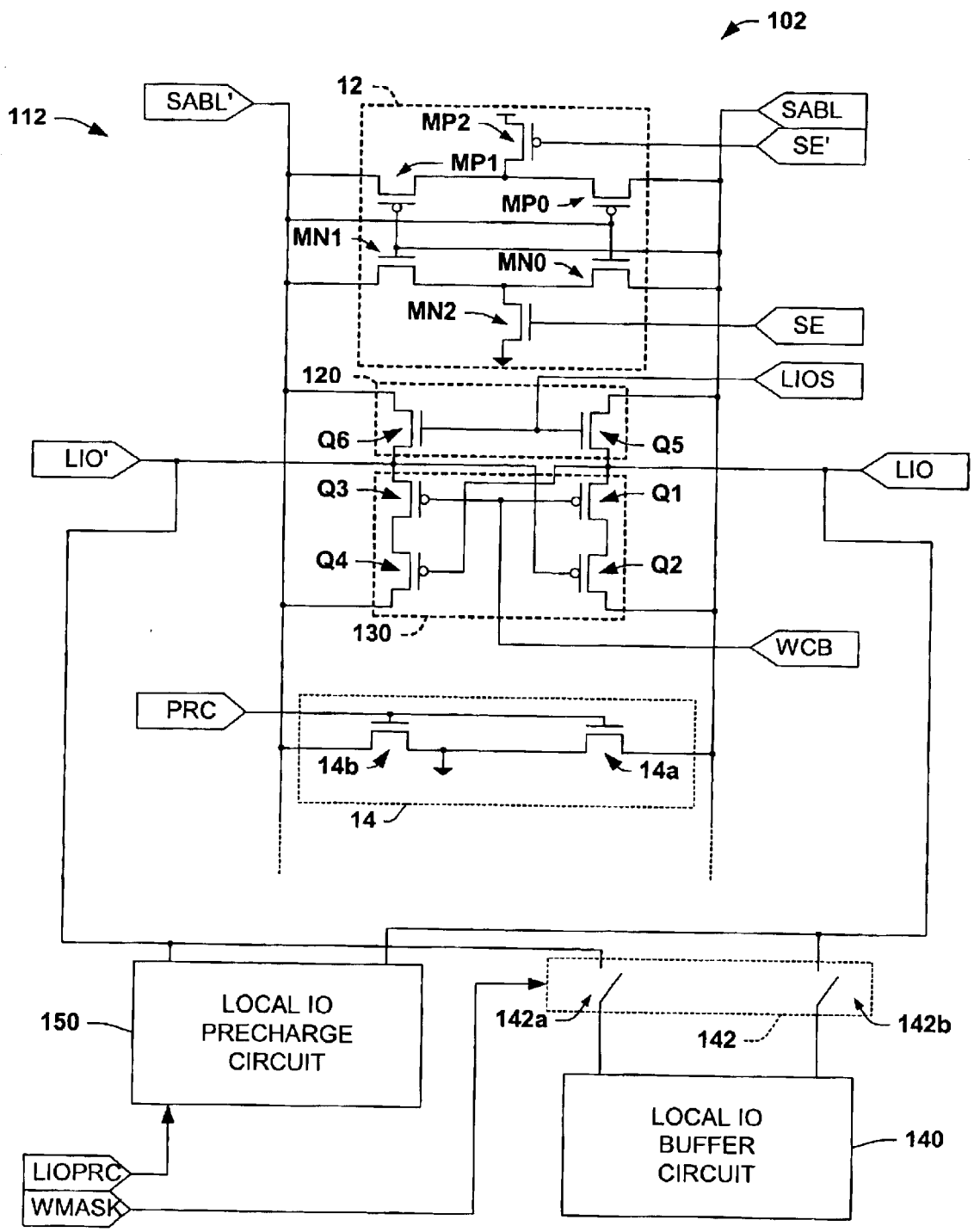
FIG. 3 is a schematic diagram illustrating an exemplary sensing system for a ferroelectric memory device in accordance with an aspect of the present invention.
Figure 4:
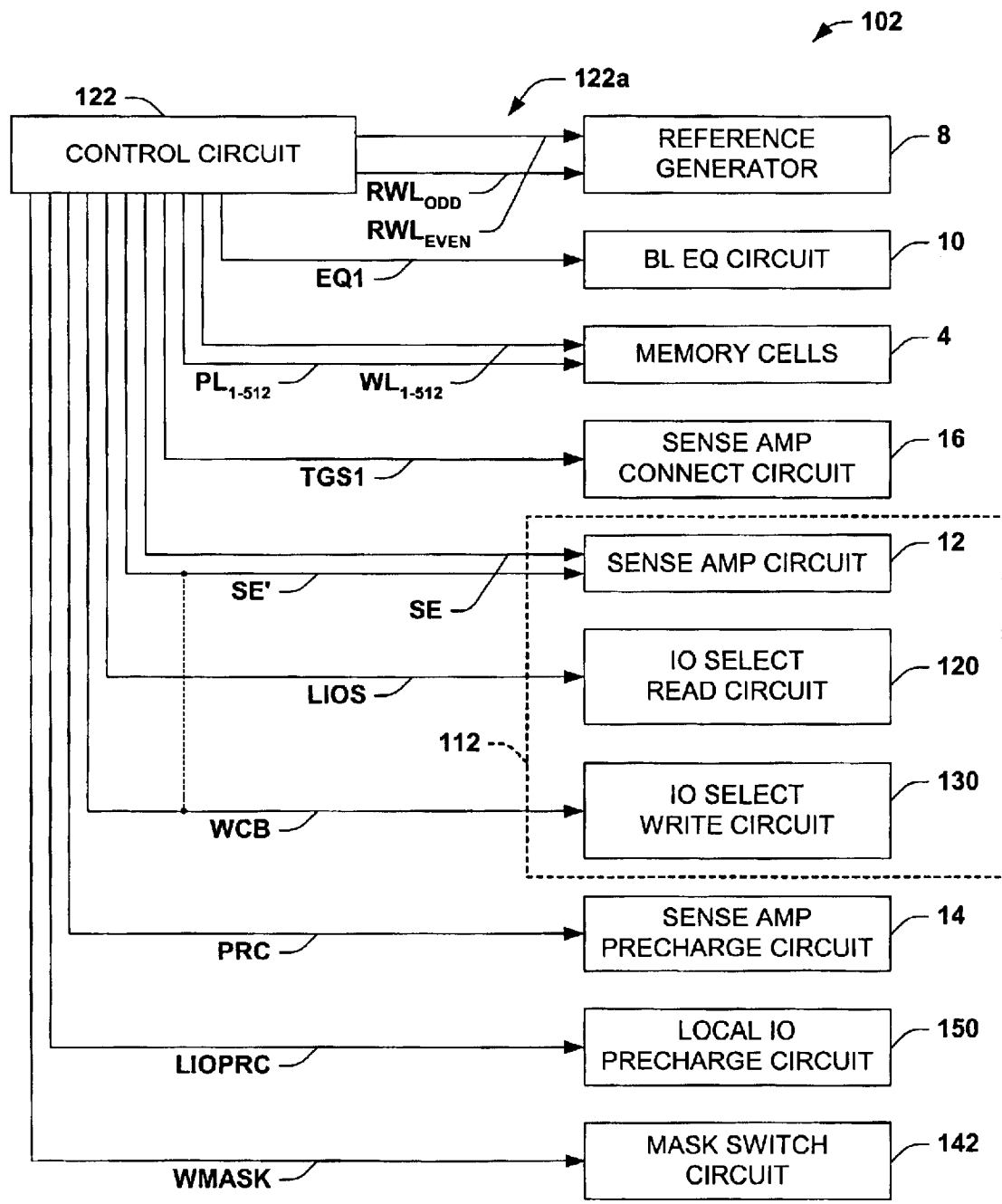
FIG. 4 is a schematic diagram illustrating an exemplary control circuit providing timing and control signals in the memory device of FIG. 3.

In accordance with the present invention, the sense amp bitlines SABL/SABL' are coupled to local IO lines LIO/ LIO', respectively, via the IO select read circuit or selection system 120 circuit comprising transistors Q5 and Q6, according to a local IO select signal LIOS from the control circuit 122. During read and write operations, the local IO lines LIO and LIO' are precharged to VDD via a local IO precharge circuit 150, as shown in FIG. 3. The switching devices Q5 and Q6 of the selection system 120 thus provide one branch or coupling path between each of the local IO lines LIO/LIO' and the corresponding one of the sense amp terminals SABL/SABL'. This first coupling branch is employed during read operations according to the local IO select signal LIOS a second time period after the sense amp enable signals SE/SE' are actuated, as illustrated and described further below.

A second coupling path or branch is provided for selective coupling of SABL with LIO or SABL' with LIO' during normal write operations via the IO select write circuit 130 according to a write control signal WCB from the control circuit 122 and according to data on the local IO lines LIO/LIO'. In this regard, the WCB signal may be provided coincident with or a first time period before the SE and SE' signals during a write operation. The circuit 130 comprises two pairs of series connected switching devices Q1/Q2 and Q3/Q4, where Q1 and Q2 are connected in series between SABL and LIO and Q3 and Q4 are connected in series between SABL' and LIO' as illustrated in FIGS. 3 and 5. In the exemplary system 112 the transistors Q1–Q4 are p-channel MOS transistors and Q5–Q6 are n-channel MOS transistors. However, other switching devices may be employed for any of these devices Q1–Q6 in accordance with the invention.

It is noted that the first and second select circuits or system 120 and 130 are distinct separate circuits in the exemplary device 102. However, one or more components may be shared among first and second select circuits in accordance with the present invention, and all such alternate implementations are contemplated as falling within the scope of the present invention, wherein separate connection branches or paths are provided for selective coupling of a sense amp with one or more local IO lines. It is further noted that the transistors Q1 and Q2 may be swapped with one another, and further that the gating signals thereto may be swapped in accordance with the invention. For example, alternate implementations of the invention may have Q1 gated by LIO' and Q2 gated by WCB. Likewise, the transistors Q3 and Q4 may be swapped in accordance with the invention, regardless of the configuration of transistors Q1 and Q2. For instance, the transistor Q3 could alternatively be gate by the signal LIO with Q4 being gated by the signal WCB. It will be appreciated that all such modifications and alterations are contemplated as falling within the scope of the present invention and appended claims, and that the invention is not limited to the examples illustrated and described herein.

The switching devices Q1 and Q3 are configured to connect LIO with Q2 and LIO' with Q4, respectively, according to the signal WCB. The device Q2 operates to selectively connect Q1 to SABL according to a voltage on LIO', wherein the IO select write circuit 130 couples LIO with SABL during write operations when the signal WCB is actuated low and when the other local IO line LIO' is driven low by a local IO buffer circuit 140 (FIG. 3). The switching device Q4 selectively connects Q3 to SABL' according to a voltage on LIO, wherein Q3 and Q4 cooperatively couple LIO' with SABL' during write operations when the signal WCB is low and when the opposite local IO line LIO is driven low by the local IO buffer circuit 140.

Because the lines LIO and LIO' are precharged to VDD, one of the transistors Q2 and Q4 will remain off during normal write operations, with the other turned on by virtue of the buffer circuit 140 pulling one of the lines LIO/LIO' low according to the data to be written to the target memory cell 4. However, where a masked write operation is undertaken, the buffer circuit 140 is inoperative to pull either of the precharged local IO lines LIO/LIO' low, through the opening of switches 142a and 142b in a mask switch circuit 142 (FIG. 3) according to a write mask signal WMASK from the control circuit 122.

It is further noted that the present invention is not limited to situations where WRB low signal is applied before or at the same time as sense amp enable signal. It is pointed out that the signal WCB low can occur after the sense amp enable. In that case the WCB low signal remains impressed for sufficient duration to write the correct state into the sense amp even if it is assumed to be in the opposite state when it was enabled, wherein all such alternate implementations are contemplated as falling within the scope of the invention and the appended claims.

Figure 6A:
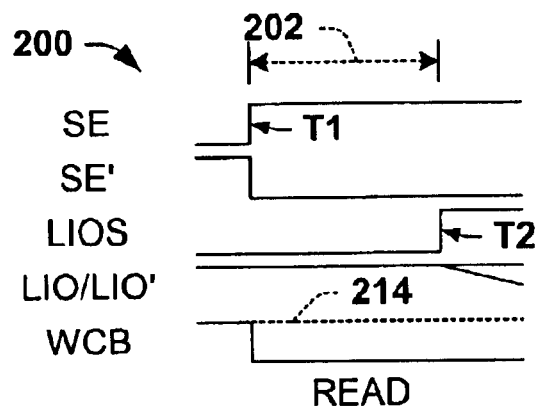
FIGS. 6A–6C are exemplary timing diagrams illustrating exemplary read and write operations in the memory device of FIGS. 3–5 in accordance with the invention.
Figure 6B:
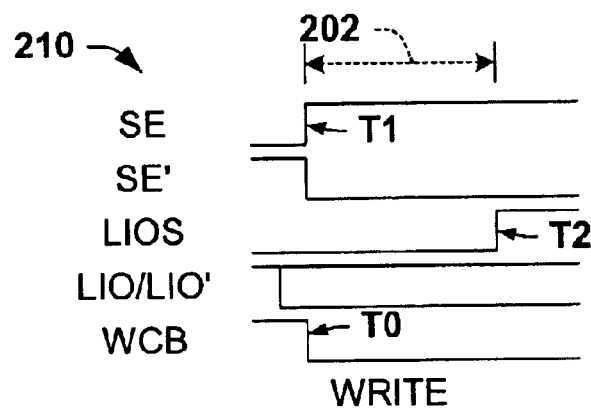
Figure 6C:
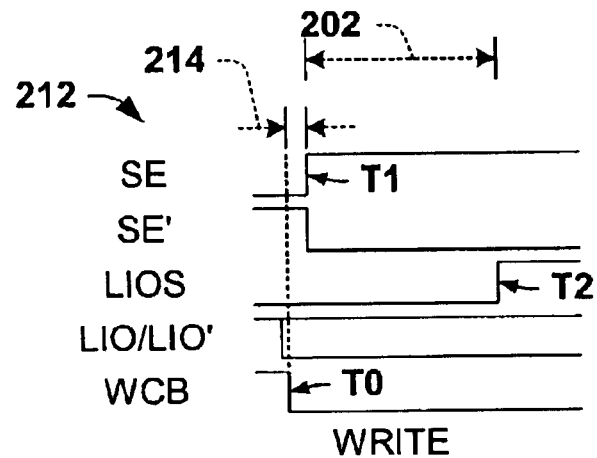

Referring also to FIGS. 6A and 6B, timing diagrams 200 and 210 illustrate signal timing for the exemplary device 102 in read and write operations, respectively. The control circuit 122 provides the sense amp enable signals SE and SE' at time T1 to enable the sense amp 12 via the transistors MN2 and MP2, respectively, during the read and write operations, and provides the local IO select signal LIOS at time T2 to Q5 and Q6 a second time period 202 after T1 during a read operation. In the illustrated implementation of the device 102, the signal SE' is also used as the write control signal WCB, so as to turn on transistors Q1 and Q3 in the circuit 130 at a time T0 coincident with the activation of the sense amp at T1. However, the signal WCB may be provided any time T0 before the sense amp 12 is enabled at T1, as shown in FIG. 6C for a write cycle. In this regard, any appropriate apparatus may be provided in accordance with the invention, by which the local IO lines LIO/LIO' are coupled with the sense amp 12 a second time period after the sense amp 12 is enabled for read operations and a first time period before sense amp activation for normal write operations, wherein the first time period may be zero.

A timing diagram 212 is provided in FIG. 6C for a write operation in an alternative implementation of the invention, wherein the WCB signal is provided by the control circuit 122 at time T0 a first time period 214 before the sense amp 12 is enabled at T1. It is noted at this point, that the first time period 214 may be any amount of time, including zero, as in the implementation illustrated in the timing diagram 210 of FIG. 6B. Moreover, it is to be appreciated that the timing diagrams 200, 210, and 212 herein are exemplary in nature and that other implementations are contemplated as falling within the scope of the invention. For instance, in another alternative implementation, the write control signal WCB need not be brought low, as illustrated in the dashed line 216 of FIG. 6A.

The control circuit 122 may be fashioned from logic and/or other components as are known in order to implement the functionality of the various signals 122a in accordance with the invention, including the local IO select and write control signals LIOS and WCB, respectively. Control circuitry for providing the local IO select and write control signals LIOS and WCB, moreover, may be separate from circuitry providing the other signals 122a, or may be integrated into a single control circuit 122 as illustrated and described herein. As illustrated in FIGS. 3–6C, the exemplary control circuit 122 also provides reference wordline signals $RWL_{ODD}$ and $RWL_{EVEN}$ to the reference generator circuit 8 for selective connection of the reference voltage $V_{REF}$ to the reference bitline, as well as the data bitline equalization signal EQ1 to equalize the data bitlines BL1/BL1' to a bitline reference voltage BLR prior to sensing operation using transistors 10a and 10b in a bitline equalization circuit 10.

The exemplary control circuit 122 further provides appropriate wordline and plateline signals WL1–WL512 and PL1–PL512, respectively, to the memory cells 4 in the device 102. These signals may be derived at least in part from address decoding circuitry (not shown) in the memory 102, taking into account the particular organization of the device 102 into blocks, section, segments, columns, rows, etc. The control circuit 122 additionally provides a T gate select signal TGS1 to the sense amp connection circuit 16 for connecting the data bitlines BL1/BL1' with the sense amp bitlines SABL/SABL' during read and write operations via transistors 16a and 16b, as well as sense amp enable signals SE/SE' to transistors MP2 and MN2 of the sense amp circuit 12. In this regard, it will be appreciated that the various aspects of the present invention may be implemented in any size memory device of any architectural configuration, including but not limited to the folded bitline organizations illustrated and described herein.

As illustrated in FIGS. 3–5 and 6A, the read operation involves sensing data from a ferroelectric memory cell 4 using the sense amp 12, and transferring the sensed data to the local IO buffer circuit 140, wherein the switches of the mask switch circuit 142 are closed to connect the buffer 140 with the local IO lines LIO and LIO'. The local IO lines LIO/LIO' are precharged to VDD via the precharge circuit 150 and the sense amp terminals SABL/SABL' are precharged to ground or VSS through the circuit 14. The sense amp 12 is enabled at time T1 through actuation of the signals SE and SE' by the control circuit 122.

In the illustrated implementation, the write control signal WCB is also actuated in concert with the sense amp enable signal SE'. However, the actuation of WCB in the read operation is optional, and does not result in early connection of the local IO lines LIO/LIO' to the sense amp terminals SABL/SABL', since the local IO lines LIO and LIO' are both precharged to VDD, thereby keeping the transistors Q2 and Q4 of the circuit 130 off. Thus, the local IO lines LIO/LIO' are coupled with the sense amp terminals by the circuit 120 later at time T2 when the control circuit 122 actuates the LIOS signal the first time period 202 after the sense amp is enabled. This implementation of the invention thus allows the second time period 202 (e.g., the relative actuation of the signals SE/SE' and LIOS) to be set so as to mitigate or avoid disruption of the cell sensing operation of the sense amp 12 during read operations.

Referring now to FIGS. 3–5 and 6B, in write operations, the local IO lines LIO/LIO' are again precharged to VDD and the sense amp terminals SABL/SABL' are precharged to VSS. In a normal (e.g., non-masked) write, the switches 142a and 142b in the circuit 142 (FIG. 3) are closed and the local IO buffer circuit 140 is used to drive one of the local IO lines LIO or LIO' low (e.g., to VSS) depending upon the write data to be stored in the target memory cell 4. The sense amp 12 is then enabled at time T1 through actuation of the signals SE and SE' by the control circuit 122. Also at time T1, the write control signal WCB is actuated, thereby turning transistors Q1 and Q3 on.

Alternatively, the WCB signal may be asserted low earlier at time T0, as illustrated in FIG. 6C, wherein the second time period 214 may be zero or a non-zero value. It is noted with respect to FIG. 6C that alternative implementations are possible, wherein the write control signal WCB is actuated at time T0, a first time period 214 before the sense amp is enabled. In this regard, the control circuit 122 may provide the signal WCB at any time T0 before the sense amp 12 is enabled, wherein the simultaneous provision of WCB and SE' is one particular implementation where the second time period 214 is zero. Other implementations are also possible, for example, wherein the local IO select signal LIOS is not actuated during write operations, for example, where LIOS is controlled to remain low during write operations.

Because one of the local IO lines is driven low by the buffer circuit 140 during a normal write operation, the other local IO line is connected to the sense amp 12 via one of the transistors Q2 or Q4 in the exemplary circuit 130. As a result, the write data is transferred to the sense amp 12 and thus to the target cell 4 at time T1, thereby allowing sufficient time for programming the ferroelectric memory cell capacitor $C_{FE}$. In this manner, the device 102 provides proper time for cell programming during write operations to accommodate the increased charge density of the ferroelectric cell capacitors $C_{FE}$, while also mitigating or avoiding the problems associated with premature connection of the local IO lines LIO/LIO' with the sense amp terminals SABL/SABL' during read operations.

The illustrated implementation of the IO select circuit 130 also provides timing control during a masked write operation in the device 102. As with the above read and non-masked write operations, the local IO lines LIO/LIO' are again precharged to VDD and the sense amp terminals SABL/SABL' are precharged to VSS. However, in a masked write operation, the switches 142a and 142b in the mask switch circuit 142 (FIG. 3) are opened by actuation of the control signal WMASK from the control circuit 122. Thus, both the local IO lines LIO and LIO' remain at the precharged levels (e.g., VDD). This prevents early coupling of the local IO lines LIO/LIO' with the sense amp terminals SABL/SABL' through the circuit 130 (e.g., both Q2 and Q4 remain off). Thus, the local IO lines LIO/LIO' are thereafter coupled with the sense amp terminals SABL/SABL' through the IO select read circuit 120 at time T2 (FIG. 6A), whereby a pseudo read operation is performed for masked cell columns. In this manner, the sensing system 112 provides appropriately timed coupling of the sense amp 12 with the local IO lines in read, normal write, and masked write operations in accordance with the invention.

Figure 7:
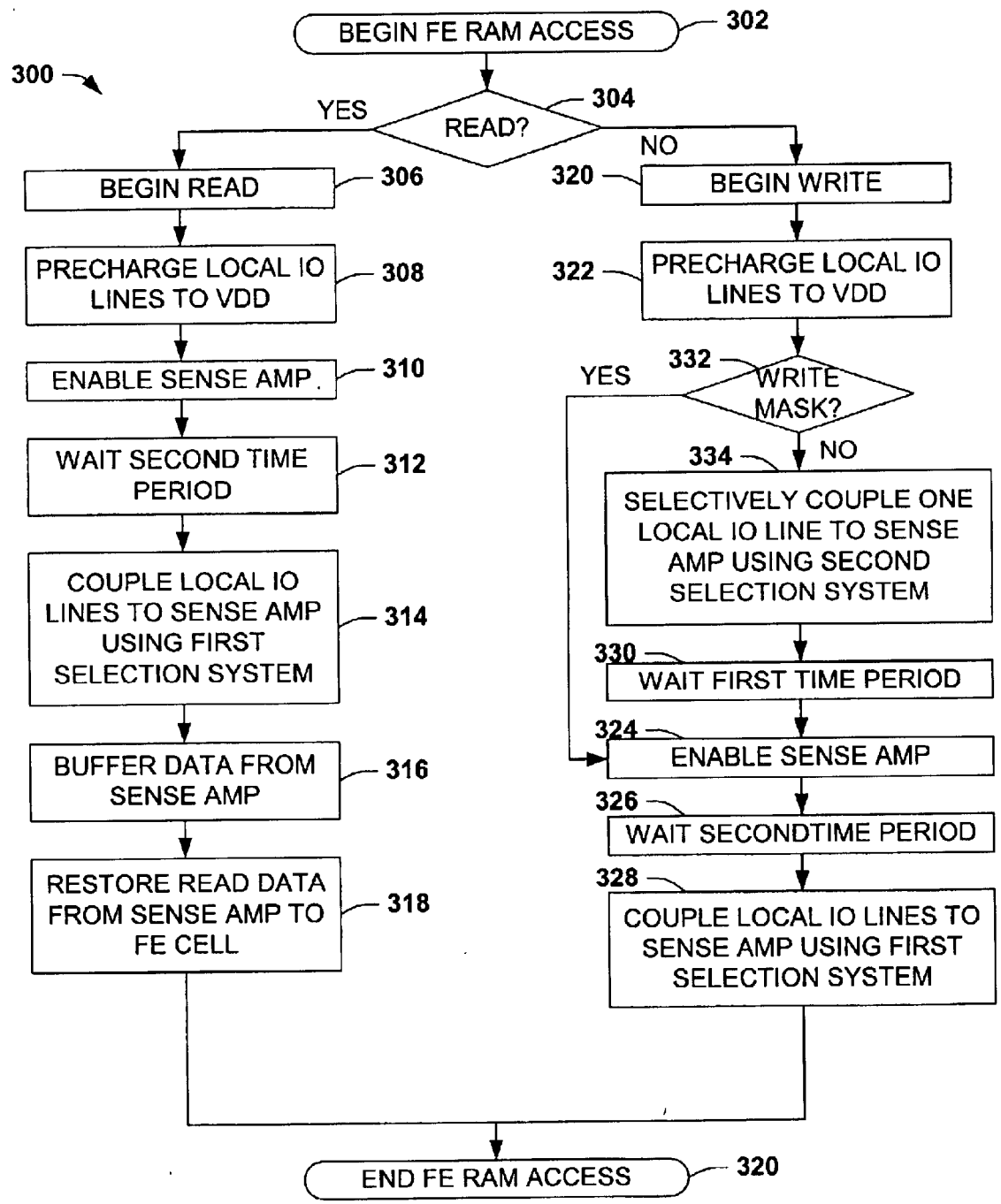
FIG. 7 is a flow diagram illustrating an exemplary method of coupling a sense amp with a local IO line in a ferroelectric memory accordance with another aspect of the invention.

Referring now to FIG. 7, another aspect of the invention provides methods for selectively coupling a sense amp to a local IO line during a memory access operation in a ferroelectric memory device. An exemplary method 300 is illustrated in FIG. 7, involving enabling the sense amp, coupling the sense amp with the local IO line a second time period after enabling the sense amp, and selectively coupling the sense amp with the local IO line a first time period before enabling the sense amp during a write operation, wherein the first time period may be zero.

Although the method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of memory devices illustrated and described herein (e.g., memory device 102 of FIGS. 3–6C) as well as in association with other structures not illustrated.

Beginning at 302, a determination is made at 304 as to whether the memory access is a read operation. If so (YES at 304), the read operation begins at 306 and the local IO lines are precharged at 308 to VDD. The sense amp is enabled at 310 (e.g., time T1 of FIG. 6A above), and the method 300 waits a second time period at 312 before coupling the local IO lines to the sense amp at 314 using a first selection system. For example, in the device 102 above, the control circuit 122 provides the LIOS signal a second time period 202 after the SE and SE' signals in a read operation. At 316, the data from the sense amp is buffered, and then restored to the target ferroelectric cell capacitor at 318 before the memory access ends at 320.

Where the ferroelectric memory access is a write operation (NO at 304), the method 300 proceeds to 320. The local IO lines are precharged to VDD at 322 and a determination is made at 324 as to whether the write operation is normal or masked. For a normal write operation (e.g., NO at 324), the sense amp is selectively coupled at 326 with one of the local IO lines and the method 300 waits a first time period at 328 before enabling the sense amp at 330. Where a masked write operation is selected (e.g., YES at 324), the sense amp is enabled at 330 without early coupling. A second time period then elapses at 332 before the local IO lines are coupled to the sense amp using the first selection system at 334 (e.g., circuit 120 of device 102 according to actuation of the LIOS signal at T2 a second time period 202 after SE and SE' at time T1 in FIG. 6B or 6C above), and the method ends at 320. This provides for delayed coupling in the case of a masked write operation to facilitate undisturbed pseudo read of the target cell. It is noted that the first time period may be zero.

If the write operation is a normal write (NO at 324), the sense amp is selectively coupled with one of the local IO lines at 326 the first time period before enabling the sense amp at 330. As illustrated and described above with respect to FIGS. 3 and 5, the local IO line (e.g., LIO or LIO') which is coupled with the sense amp at 326 may be determined according to the write data being provided to the target ferroelectric memory cell from the write buffer. Thus, in the exemplary selection circuit 130, one of the transistors Q2 and Q4 is turned on according to which of the local IO lines LIO/LIO' is driven low by the local IO buffer circuit 140, thereby providing coupling of the other local IO line with the sense amp 12.

Where the write operation is a masked write (YES at 324), however, the second selection system refrains from providing early coupling, so as to avoid disturbing the sensing operation in the sense amp during the pseudo read operation associated with the masked write. In this manner, the sensing system 112 couples the sense amp with one or more local IO lines early for normal write operations (e.g., to provide adequate charging time to program the ferroelectric memory cell capacitor), while providing delayed coupling during read and masked write operations so as to facilitate proper sense amp operation in latching data from the cell.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A sensing system for a memory device, comprising:
   a sense amp associated with a local IO line and a memory cell and operable to pass data therebetween in the memory device;
   a first IO select circuit coupled to the local IO line and the sense amp and operable to selectively couple the local IO line with the sense amp to provide data from the sense amp to the local IO line during a read operation; and
   a second IO select circuit coupled to the local IO line and the sense amp and operable to selectively couple the local IO line with the sense amp to provide data from the local IO line to the sense amp during a write operation.

2. The system of claim 1, wherein the second IO select circuit comprises first and second switching devices connected in series between the local IO line and the sense amp, wherein the first and second switching devices are adapted to selectively couple the sense amp with the local IO line according to a write control signal and according to a voltage on a complimentary local IO line during the write operation.

3. The system of claim 2, wherein the first switching device selectively connects the local IO line to the second switching device according to a voltage on a complimentary local IO line during the write operation, and wherein the second switching device selectively connects the sense amp to the first switching device according to a write control signal during the write operation.

4. The system of claim 2, wherein the first switching device selectively connects the local IO line to the second switching device according to a write control signal during the write operation, and wherein the second switching device selectively connects the sense amp to the first switching device according to a voltage on a complimentary local IO line during the write operation.

5. The system of claim 4, wherein the first IO select circuit couples the local IO line with the sense amp a second time period after the sense amp is enabled during the read operation, and wherein the second IO select circuit couples the local IO line with the sense amp a first time period before the sense amp is enabled during the write operation.

6. The system of claim 5, wherein the first IO select circuit couples the local IO line with the sense amp the second time period after the sense amp is enabled during the write operation.

7. The system of claim 6, wherein the first IO select circuit comprises a third switching device connected between the local IO line and the sense amp, wherein the third switching device connects the local IO line to the sense amp according to a local IO select signal the second time period after the sense amp is enabled during the read and write operations.

8. The system of claim 5, wherein the write control signal is a sense amp enable signal.

9. The system of claim 1, wherein the first IO select circuit couples the local IO line with the sense amp a second time period after the sense amp is enabled during the read operation, wherein the second IO select circuit couples the local IO line with the sense amp when the sense amp is enabled or a first time period before the sense amp is enabled during the write operation.

10. The system of claim 9, wherein the first IO select circuit couples the local IO line with the sense amp the second time period after the sense amp is enabled during the write operation.

11. The system of claim 1, wherein the sense amp comprises complimentary first and second sense amp terminals, the sense amp being operable to sense a differential voltage across the first and second sense amp terminals, and wherein the second IO select circuit comprises:
   first and second switching devices connected in series between a first local IO line and the first sense amp terminal, wherein the first switching device couples the first local IO line with the second switching device according to a write control signal during the write operation and the second switching device selectively couples the first sense amp terminal with the first switching device according to a voltage on a complimentary second local IO line during the write operation; and
   third and fourth switching devices connected in series between the second local IO line and the second sense amp terminal, wherein the third switching device couples the second local IO line with the fourth switching device according to the write control signal during the write operation and the fourth switching device selectively couples the second sense amp terminal with the third switching device according to a voltage on the first local IO line during the write operation.

12. The system of claim 11, wherein the first IO select circuit comprises:
   a fifth switching device connected between the first local IO line and the first sense amp terminal, wherein the fifth switching device couples the first local IO line with the first sense amp terminal according to a local IO select signal during the read operation; and
   a sixth switching device connected between the second local IO line and the second sense amp terminal, wherein the sixth switching device couples the second local IO line with the second sense amp terminal according to the local IO select signal during the read operation.

13. The system of claim 12, wherein the first, second, third, and fourth switching devices are transistors of a first type, and wherein the fifth and sixth switching devices are transistors of a second type.

14. The system of claim 13, wherein the first, second, third, and fourth switching devices are p-channel MOS transistors and the fifth and sixth switching devices are n-channel MOS transistors.

15. The system of claim 12:
   wherein the fifth switching device couples the first local IO line with the first sense amp terminal and the sixth switching device couples the second local IO line with the second sense amp terminal a second time period after the sense amp is enabled during the read and write operations; and
   wherein the first switching device couples the first local IO line with the second switching device and the third switching device couples the second local IO line with the fourth switching device when the sense amp is enabled or a first time period before the sense amp is enabled during the write operation.

16. The system of claim 12, wherein the fifth switching device couples the first local IO line with the first sense amp terminal and the sixth switching device couples the second local IO line with the second sense amp terminal a second time period after the sense amp is enabled during the read and write operations, and wherein the first switching device couples the first local IO line with the second switching device and the third switching device couples the second local IO line with the fourth switching device approximately when the sense amp is enabled during the write operation.

17. The system of claim 11, wherein the first, second, third, and fourth switching devices are p-channel MOS transistors.

18. A memory device, comprising:
   a first selection system coupled with a local IO line and a sense amp and operable to selectively couple the local IO line with the sense amp a second time period after the sense amp is enabled during a read operation; and
   a second selection system coupled with the local IO line and the sense amp and operable to selectively couple the local IO line with the sense amp when the sense amp is enabled or a first time period before the sense amp is enabled during a write operation.

19. The memory device of claim 18, wherein the second selection system comprises first and second switching devices connected in series between the local IO line and the sense amp, wherein the first switching device selectively couples the sense amp to the second switching device according to a write control signal during the write operation, and wherein the second switching device selectively couples local IO line to the first switching device according to a voltage on a complimentary local IO line during the write operation.

20. The memory device of claim 18, wherein the second selection system comprises first and second switching devices connected in series between the local IO line and the sense amp, wherein the first switching device selectively couples the local IO line to the second switching device according to a write control signal during the write operation, and wherein the second switching device selectively couples the sense amp to the first switching device according to a voltage on a complimentary local IO line during the write operation.

21. The memory device of claim 20, wherein the first selection system comprises a third switching device connected between the local IO line and the sense amp, wherein the third switching device connects the local IO line to the sense amp according to a local IO select signal during the read and write operations, the memory device further comprising a control circuit providing a sense amp enable signal to enable the sense amp during the read and write operations, providing the local IO select signal to the third switching device the second time period after providing the sense amp enable signal during the read and write operations, and providing the write control signal to the first switching device when the sense amp is enabled or the first time period before providing the sense amp enable signal during the write operation.

22. The memory device of claim 18, wherein the second selection system comprises:
   first and second switching devices connected in series between a first local IO line and a first sense amp terminal, wherein the first switching device couples the first local IO line with the second switching device according to a write control signal during the write operation and the second switching device selectively couples the first sense amp terminal with the first switching device according to a voltage on a complimentary second local IO line during the write operation; and
   third and fourth switching devices connected in series between the second local IO line and a second sense amp terminal, wherein the third switching device couples the second local IO line with the fourth switching device according to the write control signal during the write operation and the fourth switching device selectively couples the second sense amp terminal with the third switching device according to a voltage on the first local IO line during the write operation.

23. The memory device of claim 22, wherein the first selection system comprises:
   a fifth switching device connected between the first local IO line and the first sense amp terminal, wherein the fifth switching device couples the first local IO line with the first sense amp terminal according to a local IO select signal during the read and write operations; and
   a sixth switching device connected between the first local IO line and the first sense amp terminal, wherein the sixth switching device couples the second local IO line with the second sense amp terminal according to the local IO select signal during the read and write operations.

24. The memory device of claim 23, further comprising a control circuit operatively coupled with the sense amp and the first and second selection systems, the control circuit providing a sense amp enable signal to enable the sense amp during the read and write operations, providing the local IO select signal to the fifth and sixth switching devices the second time period after providing the sense amp enable signal during the read and write operations, and providing the write control signal to the first, and third switching devices when providing the sense amp enable signal or the first time period before providing the sense amp enable signal during the write operation.

25. The memory device of claim 24, wherein the first, second, third, fourth, fifth, and sixth switching devices are MOS transistors.

26. The memory device of claim 25, wherein the first, second, third, and fourth switching devices are p-channel transistors and the fifth and sixth switching devices are n-channel transistors.

27. The memory device of claim 22, further comprising a local IO precharge circuit operatively coupled with the first and second local IO lines and operable to precharge the first and second local IO lines to a first voltage before the sense amp is enabled during a write operation, wherein the second switching device selectively couples the first sense amp terminal with the first switching device during the write operation if the voltage on the second local IO line is a second voltage different from the first voltage, and wherein the fourth switching device selectively couples the second sense amp terminal with the third switching device during the write operation if the voltage on the first local IO line is a second voltage different from the first voltage.

28. A method for selectively coupling a sense amp to a local IO line during a memory access operation in a memory device, the method comprising:
  enabling the sense amp;
  coupling the sense amp with the local IO line a second time period after enabling the sense amp; and
  selectively coupling the sense amp with the local IO line when enabling the sense amp or a first time period before enabling the sense amp during a write operation.

29. The method of claim 28, wherein selectively coupling the sense amp with the local IO line the first time period before enabling the sense amp comprises coupling the sense amp with the local IO line the first time period before enabling the sense amp during a non-masked write operation.

30. The method of claim 29, wherein coupling the sense amp with the local IO line during the non-masked write operation comprises connecting the sense amp to a first local IO line according to a voltage on a complimentary local IO line during the non-masked write operation.

31. The method of claim 28, wherein coupling the sense amp with the local IO line the second time period after enabling the sense amp comprises connecting the sense amp to the local IO line the second time period after enabling the sense amp during read and write operations.

32. A memory device, comprising:
  first and second local IO lines;
  a sense amp comprising first and second sense amp inputs;
  first and second switching devices coupled in series between the first sense amp input and the first local IO line, wherein one of the first and second switching devices is gated by the second local IO line and the other is gated by a write control signal; and
  third and fourth switching devices coupled in series between the second sense amp input and the second local IO line, wherein one of the third and fourth switching devices is gated by the first local IO line and the other is gated by the write control signal.

33. The memory device of claim 32, wherein complimentary signals are applied to the first and second local IO lines.

34. The memory device of claim 32, wherein the switching devices are p-channel MOSFET transistors.

* * * * *